US005471421A

United States Patent [19]
Rose et al.

[11] Patent Number: 5,471,421
[45] Date of Patent: Nov. 28, 1995

[54] STORAGE CELL USING LOW POWERED/LOW THRESHOLD CMOS PASS TRANSISTORS HAVING REDUCED CHARGE LEAKAGE

[75] Inventors: James W. Rose, San Carlos; Godfrey P. D'Souza, Santa Clara; Jonathan J. Stinehelfer, San Jose; James F. Testa, Mountain View, all of Calif.

[73] Assignee: Sun Microsystems, Inc., Del.

[21] Appl. No.: 358,202

[22] Filed: Dec. 16, 1994

[51] Int. Cl.$^6$ ............................................. Q11C 13/00
[52] U.S. Cl. ......................... 365/182; 365/189.09
[58] Field of Search ........................ 365/182, 189.01, 365/189.09, 226

[56] References Cited

U.S. PATENT DOCUMENTS 5,229,963  7/1993  Ohtsuka et al. .................. 365/189.09

OTHER PUBLICATIONS

T. Kawahara, et al., "Subthreshold Current Reduction for Decoded–Driver by Self–Reverse Biasing," *IEEE J. of Solid–State Circuits*, 28:1136–1144 (Nov. 1993).
T. Sakata, et al., "Two–Dimensional Power–Line Selection Scheme for Low Subthreshold–Current Multi–Gigabit DRAM's," *IEEE J. of Solid–State Circuits* 29:887–894 (Aug. 1994).
T. Sakata, et al., "Subthreshold–Current Reduction Circuits for Multi–Gigabit DRAM's," *IEEE J. of Solid–State Circuits* 29:761–769 (Jul. 1994).
J. Testa, et al., "Lowered Supply and Threshold Voltage Effects on CMOS Circuit Characteristics," *SMLI 94–0179* pp. 1–25 (Jul. 15, 1994).
N. H. E. Weste, K. Eshraghian, "5.4.3 Pseudo–nMOS Logic," *Principles of CMOS VLSI Design A Systems Perspective*, Addison–Wesley Publishing Co., 2d Ed., pp. 298–302 and 308–311 (1993).
Y. Tsukikawa et al., "An Efficient Back–Bias Generator with Hybrid Pumping Circuit for 1.5–V DRAM's", IEEE Journal of Solid–State Circuits, vol. 29, No. 4, pp. 534–538 (Apr. 1994).
Hiroyuki Yamauchi et al. "A Sub–0.5µA/MB Data–Retention DRAM", 1995 IEEE International Solid–State Circuits Conference, Session 14, Feb. 17, 1995, pp. 244, 245 and 373.
Masayuki Nakamura et al., "A 29ns 64Mb DRAM with Hierarchical Array Architecture", 1995 IEEE International Solid–State Circuits Conference, Session 14, Feb. 17, 1995, pp. 246, 247 and 373.
Tadato Yamagata et al., "Circuit Design Techniques for Low–Voltage Operating and/or Giga–Scale DRAMs" 1995 IEEE International Solid–State Circuits Conference, Feb. 17, 1995, pp. 248, 249 and 374.

*Primary Examiner*—Terrell W. Fears
*Attorney, Agent, or Firm*—Limbach & Limbach

[57] ABSTRACT

A storage cell includes a first bit line, a storage circuit, and a pass transistor. The storage circuit has a first storage node for holding a logic state indicative of a logic value. The pass transistor is coupled to the first bit line and the first storage node for establishing a conduction path therebetween. The pass transistor receives a bias voltage to switch the pass transistor into a substantially nonconducting state when the storage cell is not being accessed. The reverse bias on the first transistor substantially reduces the leakage current through the pass transistor.

23 Claims, 4 Drawing Sheets

STORAGE CELL USING LOW POWERED/LOW THRESHOLD CMOS PASS TRANSISTORS HAVING REDUCED CHARGE LEAKAGE

BACKGROUND OF THE INVENTION

1. Field of the Invention

The present invention relates to storage cells in memory arrays, and in particular, to storage cells operating with low power supply voltages.

2. Description of the Related Art

Dynamic random access memories (DRAMs) and static random access memories (SRAMs) typically include a number of storage cells that are organized in arrays having a plurality of rows and columns. In both DRAMs and SRAMs, a word line is associated with each row in the array. In DRAMs, one bit line is associated with each column in the array. With SRAMs, differential bit lines are associated with each column in the array. The reading or writing of a particular cell or row of cells in both DRAMs and SRAMs is performed using decoders, sense amplifiers, multiplexer circuits, write drivers, etc., in a well known manner, and is therefore not explained in greater detail herein.

A DRAM storage cell includes a pass transistor and a storage capacitor having a storage plate and a ground plate. The gate of the pass transistor of the cell is coupled to the word line associated with the row containing the cell. The source of the pass transistor is coupled to the storage plate of the capacitor and the drain is coupled to the bit line associated with the column containing the cell. When the cell is not being accessed (standby mode), the word line associated with the cell is typically held at VSS (e.g. 0.0 volts). To access the cell, the word line is driven high to VDD (e.g. 3.3 or 5.0 volts), causing the pass transistor to turn on. The pass transistor turns on when its gate potential (i.e., the word line) exceeds the threshold voltage $V_{TH}$ (e.g. 0.7 volts) of the transistor. During a write operation, the data present on the bit line is passed through the pass transistor, and is stored on the charge plate of the capacitor. Alternatively, during a read operation, the charge stored on the charge plate is "dumped" onto the bit line, and is then sensed to determine its value.

An SRAM storage cell typically includes two pass transistors and two inverters each having its output coupled to the other's input. The gates of the pass transistors are coupled to the word line associated with the row containing the cell. The source of the first pass transistor is coupled to the output of the first inverter and the input of the second inverter. The source of the second pass transistor is coupled to the output of the second inverter and the input of the first inverter. The drain of the first pass transistor is coupled to a first bit line associated with the column containing the cell, and the drain of the second pass transistor is coupled to a second bit line, or a "bit line bar", associated with the column. The operation of an SRAM storage cell is similar to a DRAM, except that the SRAM stores one charge on the output of one inverter and the complement of that charge on the output of the other inverter. During a write operation, the data present on the bit line is passed through the first pass transistor and is stored on the output of the first inverter, and the data present on the bit line bar is passed through the second pass transistor and is stored on the output of the second inverter. During a read operation, the logic levels stored on the outputs of the inverters are coupled onto the respective bit lines and sensed. Because inverters, rather than a capacitor, are used to maintain the stored charges, the SRAM is capable of maintaining the stored data for long periods of time without having to be electrically refreshed like the DRAM.

In prior art DRAM and SRAM storage cells, it is common to apply a negative substrate bias potential $V_{sb}$ to the pass transistor. The negative substrate bias potential $V_{sb}$ maintains the pass transistor in a "hard" off state, thereby reducing the loss of charge on the storage capacitor due to leakage through the pass transistor. The back bias potential $V_{sb}$ has the effect of shifting the $V_{TH}$ of the pass transistor, which in turn, reduces the leakage current through the device. The drawback of applying a negative substrate potential $V_{sb}$ is that it detrimentally affects the switching speed (frequency) of the pass transistor. As a result the average time required to access the cells in the array is increased.

In recent years, complementary metal oxide semiconductor field effect transistor (CMOS) logic has seen ever increasing use in digital systems. As MOSFET technology has evolved, individual MOSFETs have become steadily smaller, e.g. with smaller feature sizes, particularly shorter channel lengths. This has allowed more and more MOSFETs to be integrated together in one integrated circuit (IC), as well as allow the requisite power supply voltage (VDD) to become smaller as well. Benefits of the former include reduced size and increased operating frequencies, while benefits of the latter include reduced power consumption. However, operating MOSFETs at today's lower power supply voltages has the undesirable effect of lowering MOSFET current which reduces the maximum operating frequency. Hence, in order to minimize reductions in circuit performance, the MOSFET threshold voltages $V_{TH}$ are reduced so as to minimize reductions in the MOSFET current. (Further discussion of the relationship(s) between power supply voltage, threshold voltage and operating performance for MOSFETs can be found in commonly assigned, copending U.S. patent application Ser. No. 08/292,513, filed Aug. 18, 1994, and entitled "Low Power, High Performance Junction Transistor", the disclosure of which is hereby incorporated herein by reference.) However, this in turn has the undesired effect of increasing MOSFET leakage current, i.e., MOSFET current flowing when the device is turned off.

Accordingly, building DRAM and SRAM devices using low powered and/or threshold MOS devices is problematic because the pass transistors in the devices have a tendency to leak. Leakage current in the pass transistors of DRAMs and SRAMs can cause the cells to fail. Specifically, leakage through the pass transistors accumulates onto the bit lines which prevents a sensing amplifier from sensing. Accordingly, it would be desirable to have a storage cell having pass transistors capable of operating at a low power supply voltage and/or having low threshold voltage with minimal reduction in its maximum operating frequency and reduced charge leakage.

SUMMARY OF THE INVENTION

In accordance with the present invention, a pass transistor of a storage cell is provided. When the storage cell is not being accessed, the pass transistor is reverse biased so the transistor is maintained in a "hard" off state. Such biasing substantially reduces the current leakage of the pass transistor when the storage cell is operated at a low power supply voltage and/or threshold voltage. In one embodiment of the invention, a reverse-bias voltage is applied to the gate of the pass transistor when the memory cell is not being accessed. The reverse-bias voltage is applied to the pass transistor through the word line coupled to the gate of the device. A word line driver drives the word line to a turn on voltage to turn on the pass transistor when the memory cell is being accessed and to a reverse-biasing voltage when the memory cell is not being accessed.

These and other features and advantages of the present invention will be understood upon consideration of the following detailed description of the invention and the accompanying drawings.

BRIEF DESCRIPTION OF THE DRAWINGS (Like elements are identified with like alphanumeric designators throughout the drawings.)

DETAILED DESCRIPTION OF THE INVENTION

Figure 1:
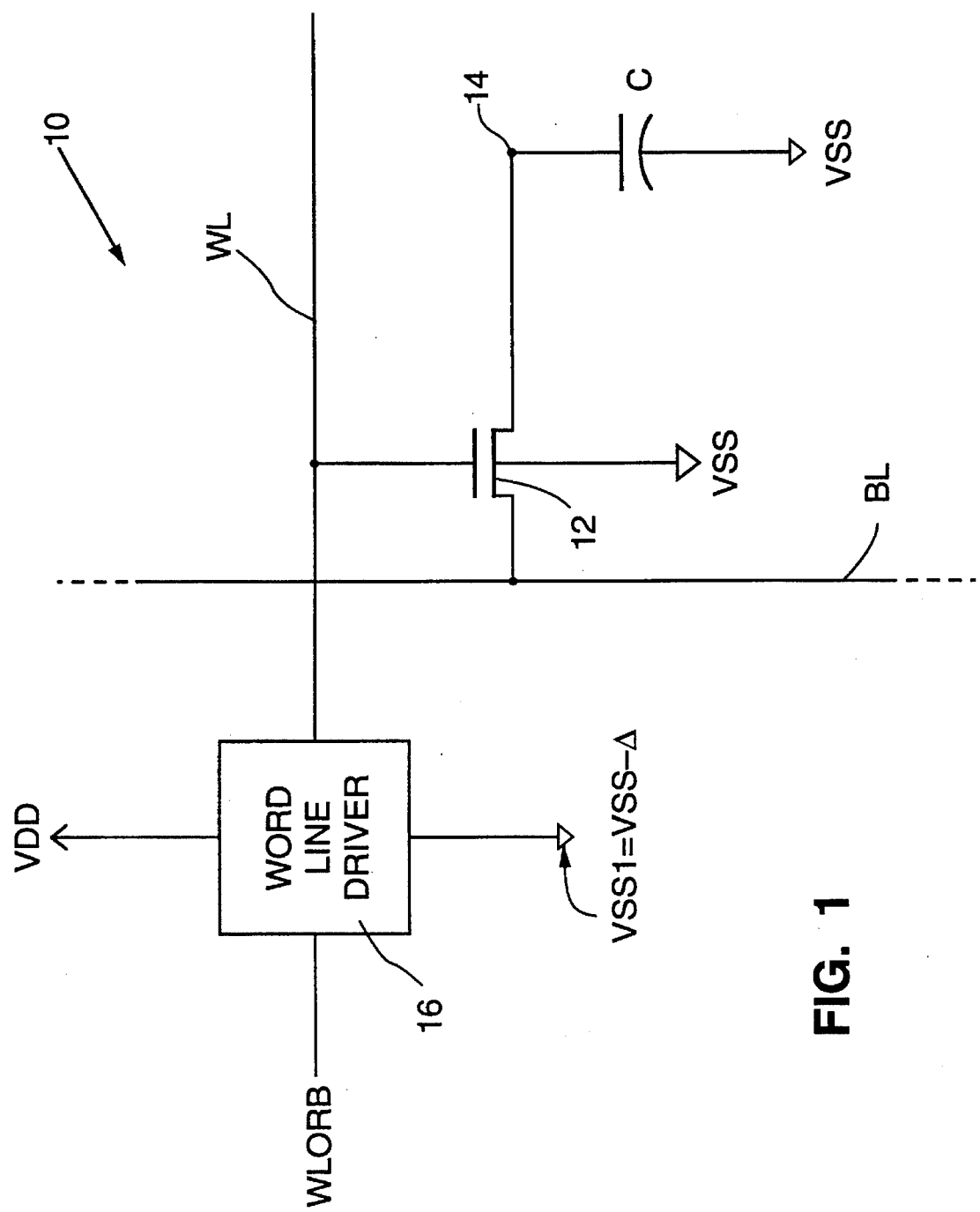
FIG. 1 is a schematic diagram illustrating a DRAM storage cell in accordance with the present invention.

Throughout the following discussion, unless indicated otherwise, it is assumed that all p-channel MOSFET (P-MOSFET) and n-channel MOSFET (N-MOSFET) substrates, or "bulks," are connected to their respective MOSFET voltage supplies (e.g. typically to power supply nodes VDD and VSS, respectively).

As mentioned above, reducing a pass MOSFET's threshold voltage $V_{TH}$ in order to compensate for decreased circuit performance caused by lower power supply voltages has the undesired effect of increasing leakage current through the pass transistor. Specifically, leakage current is increased because, as threshold voltage $V_{TH}$ is decreased, the pass transistor becomes more difficult to turn off. For example, assume that an N-MOSFET pass transistor having a threshold voltage $V_{TH}$ equal to 0.7 volts is operating with a voltage supply VDD of 3.3 volts and a voltage supply VSS of 0.0 volts. Assuming that the source of the pass transistor is coupled to the voltage supply VSS, when the gate is pulled down to voltage level VSS, the pass transistor is turned off hard and leakage current is minimized because its gate-source voltage $V_{GS}$ is equal to 0.0 volts, well below the threshold voltage $V_{TH}$ of 0.7 volts. On the other hand, assume that the voltage supply VDD is decreased in order to decrease power consumption and that the voltage supply VSS is maintained at 0.0 volts. The voltage supply VDD may be decreased to any value such as, for example, 2.8, 2.5, or even 1.0 volts. Furthermore, in order to compensate for reduced MOSFET current, assume that the threshold voltage $V_{TH}$ of the pass transistor is also decreased. For example, the threshold voltage $V_{TH}$ may be decreased to a value such as 0.0 or −0.3 volts. Now when the gate of the pass transistor is pulled down to voltage level VSS, the gate-source voltage $V_{GS}$, which is equal to 0.0 volts, will either be equal to the threshold voltage $V_{TH}$, if $V_{TH}$=0.0 volts, or above the threshold voltage $V_{TH}$, if $V_{TH}$=−0.3 volts. In this scenario, the pass transistor is either not completely turned off or not turned off at all and leakage current is conducted.

In accordance with the present invention, one way to substantially reduce the N-MOSFET's leakage current in the second scenario of the above example is to drive the gate of the pass transistor below the voltage supply VSS. For example, assume that the source of the pass transistor remains coupled to the voltage supply VSS, but that the gate is driven by a signal having a logic low level of VSS1= VSS−Δ. If Δ=0.2 volts, then when the gate is pulled low, the gate voltage $V_G$ will be −0.2 volts, but the source voltage $V_S$ will remain 0.0 volts. Thus, the gate-source voltage $V_{GS}$= $V_G$− $V_S$ will be −0.2 volts. If the threshold voltage $V_{TH}$ is equal to 0.0 volts, then the pass transistor will be turned off fairly hard because the gate-source voltage $V_{GS}$ is below the threshold voltage $V_{TH}$. The pass transistor is therefore turned off harder than if the gate-source voltage $V_{GS}$ were equal to 0.0 volts. This will result in the leakage current being substantially reduced.

Referring to FIG. 1, a DRAM storage cell 10 in accordance with the present invention includes a pass N-MOSFET 12 having its drain coupled to a bit line BL and its source coupled to a storage node 14. The gate of the pass N-MOSFET 12 is coupled to a word line WL. A storage capacitor C having a storage plate and a ground plate is coupled between the storage node 14 and the voltage supply VSS. Specifically, the storage plate is coupled to the storage node 14, and the ground plate is coupled to the voltage supply VSS. The pass transistor 12 may be any low powered and/or low threshold transistor such as those described in the aforementioned U.S. patent application Ser. No. 08/292,513 or commonly assigned, copending U.S. patent application Ser. No. 08/357,436, filed Dec. 10, 1994, and entitled "Asymmetric Low Power MOS Devices", the disclosures of which are both hereby incorporated herein by reference.

According to one embodiment, the pass N-MOSFET 12 has a channel width of 1 micron and a channel length of 0.6 microns, and the storage capacitor C has a value of 10 fF. It should be understood that such dimensions are intended to be exemplary only and are not intended to require or be limited to any specific semiconductor processing technology, and as semiconductor processing technology advances further such dimensions may be altered, e.g. reduced, as desired. (For example, it should be understood that fabrication of circuitry embodying the present invention can be done in accordance with many well known semiconductor processes or alternatively, in accordance with those processes discussed in the aforementioned U.S. Patent Applications.)

In accordance with the present invention, a word line driver 16 is used to drive the word line WL of the DRAM 10. The word line driver 16 is coupled to the power supply VDD and to a power supply VSS1 having a value equal to VSS−Δ. The purpose of the word line driver 16 is to receive at its input WLORB a logic signal from a decoder circuit (not shown) indicating that the DRAM storage cell 10 is to be accessed. When accessed, the word line driver 16 drives the word line WL to VDD, thereby turning on the pass transistor 12. Otherwise, the word line driver circuit 16 maintains the word line WL at VSS1. It should be understood that many different types of circuits may be used to implement to the word line driver 16. An example of one such circuit will be described below in connection with FIG. 3.

When the DRAM cell 10 is not being accessed (standby), the word line driver 16 pulls the gate of the pass N-MOSFET 12 below the voltage level VSS down to the voltage level VSS1. This results in the pass N-MOSFET's 12 gate voltage $V_G$ being below its source voltage $V_S$ which will turn off the pass N-MOSFET 12 "harder" and Is substantially reduce leakage current therethrough. Accordingly, the charge on storage node 14 is substantially maintained. During an access operation, the word line driver circuit 16 drives the word line WL high (VDD) turning on the pass transistor 12, and the storage node 14 is accessed in a well known manner.

Figure 2:
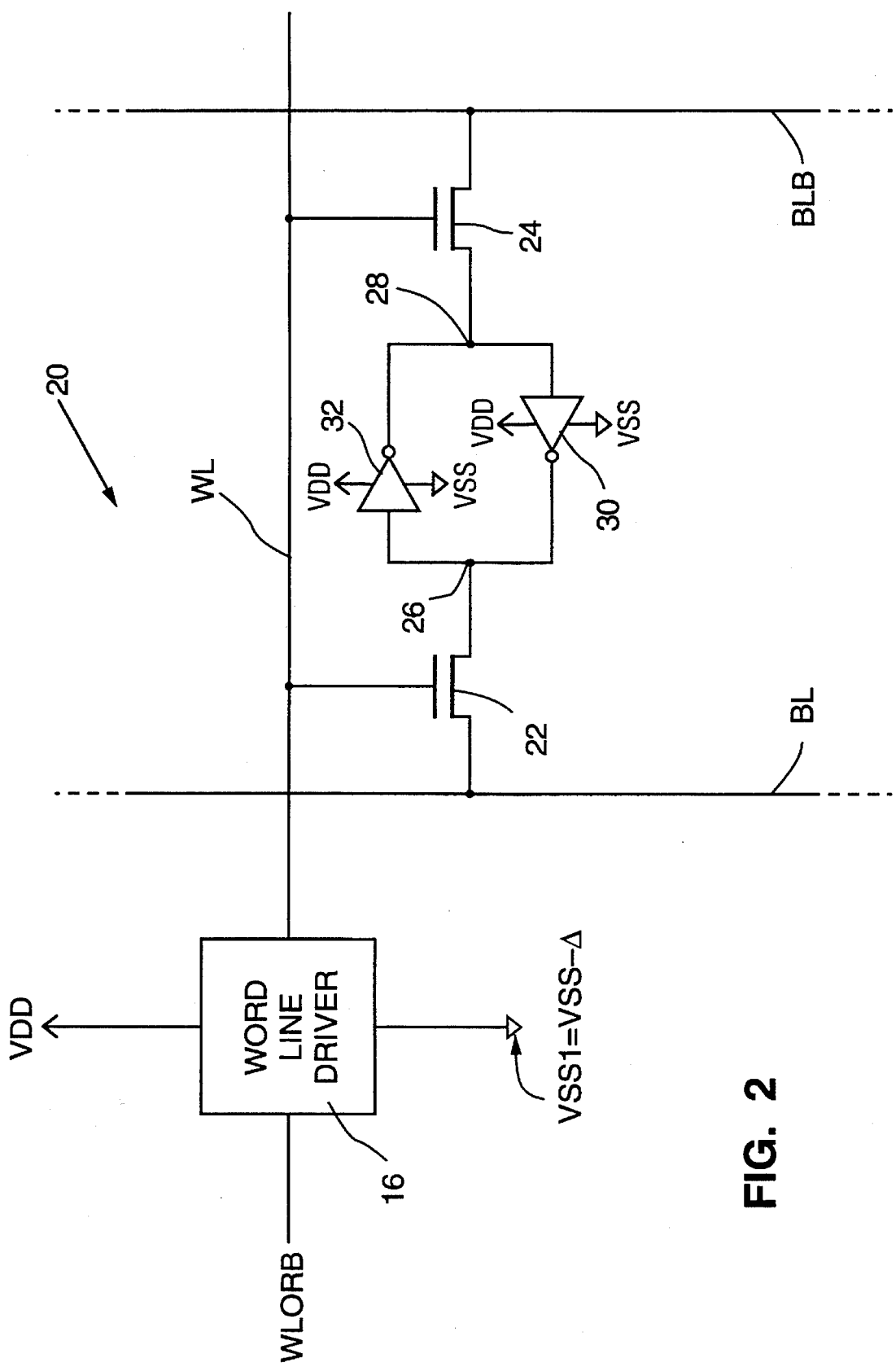
FIG. 2 is a schematic diagram illustrating an SRAM storage cell in accordance with the present invention.

Referring to FIG. 2, an SRAM storage cell 20 in accordance with the present invention includes two pass N-MOSFETs 22, 24. The pass N-MOSFET 22 has its drain coupled to the bit line BL and its source coupled to a first storage node 26. The pass N-MOSFET 24 has its drain coupled to the bit line bar BLB and its source coupled to a second storage node 28. The gates of the pass N-MOSFETs 22, 24 are coupled to the word line WL. A first inverter 30 has its output coupled to the first storage node 26 and its input coupled to the second storage node 28, and a second inverter 32 has its output coupled to the second storage node 28 and its input coupled to the first storage node 2(5. The inverters 30, 32 are each coupled to the power supplies VDD and VSS. The pass transistors 22, 24 are low powered and/or low threshold N-MOSFETs, such as those described in the above-mentioned co-pending applications.

According to one embodiment, the pass N-MOSFETs 22, 24 each have a channel width of 1 micron and a channel length of 0.6 microns. Furthermore, the P-MOSFETs (not shown) which form the inverters 30, 32 each have a channel width of 1 micron and a channel length of 0.6 microns, and the N-MOSFETs (not shown) which form the inverters 30, 32 each have a channel width of 2 microns and a channel length of 0.6 microns. It should be understood, however, that these are only example channel sizes and that they may be changed without departing from the scope of the present invention.

In accordance with the present invention, the word line driver 16 is used to drive the word line WL of the SRAM 20. During operation, one of the first and second storage nodes 26, 28 will be discharged to the voltage level VSS, and the other of the first and second storage nodes 26, 28 will be charged to the voltage level VDD. When the SRAM cell 20 is not being accessed (standby), the word line driver 16 pulls the gates of the pass N-MOSFETs 22, 24 below the voltage level VSS down to the voltage level VSS1. This results in the pass N-MOSFETs' 22, 24 gate voltages $V_G$ being below their source voltages $V_S$ which turns off the pass N-MOSFETs 22, 24 harder to substantially reduce leakage current therethrough. Accordingly, the charge on nodes 26 and 28 is maintained. During an access operation, the word line drive circuit 16 drives the word line WL high (VDD), turning on the pass transistors 22, 24, and the SRAM cell 20 is accessed in a well known manner.

Figure 3:
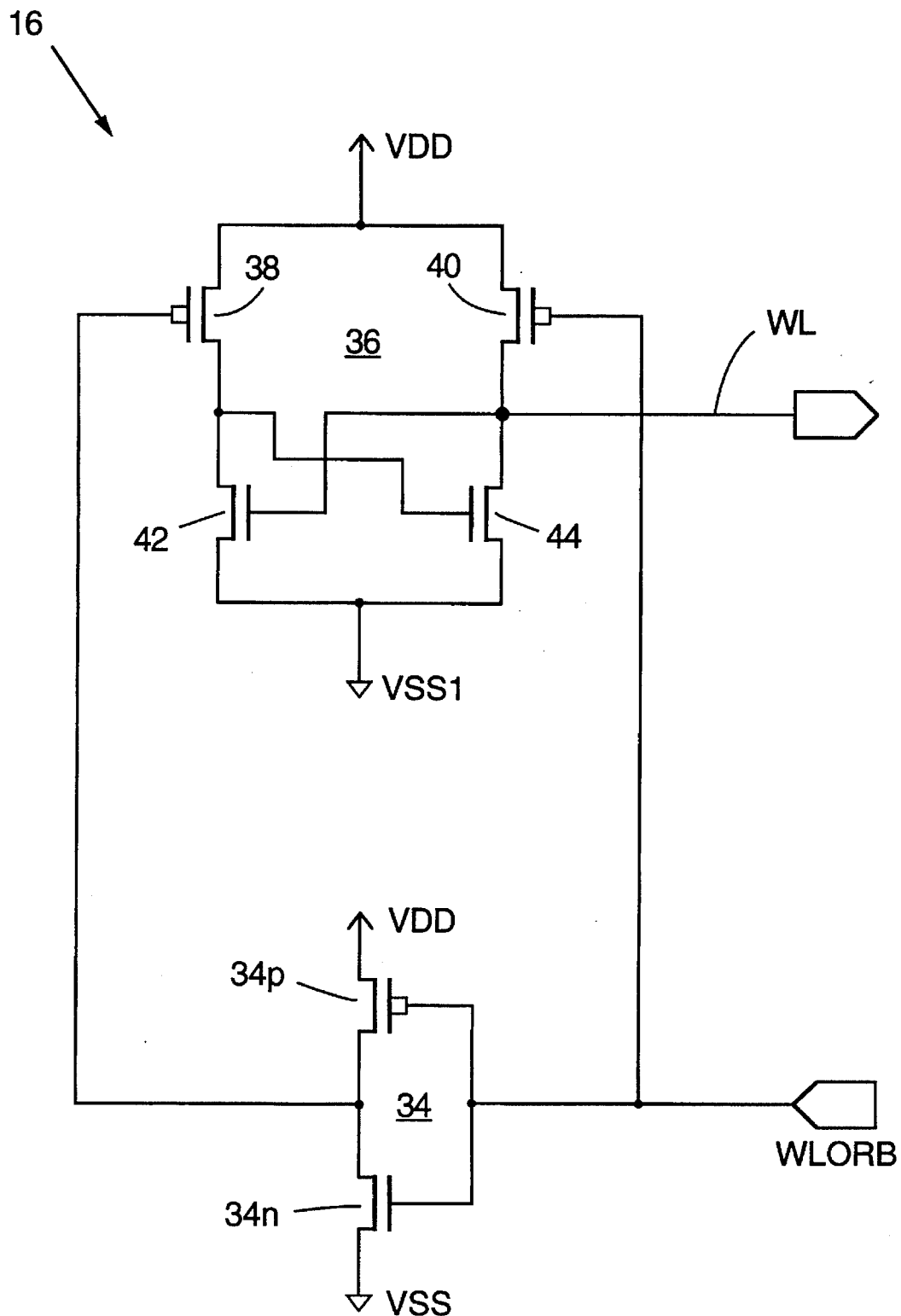
FIG. 3 is a schematic diagram illustrating a circuit which may be used for the word line driver shown in FIGS. 1 and 2.

Referring to FIG. 3, an example of a circuit which may be used to implement the word line driver 16 includes an inverter 34 and a level translator 36. As mentioned above, the purpose of the word line driver 16 is to convert the logic levels of the input WLORB from a logic low level of VSS and a logic high level of VDD to an output WL having a logic low level of VSS1=VSS−Δ and a logic high level of VDD. Inverter 34, which is coupled to the power supplies VDD and VSS, is constructed from an N-MOSFET 34n and a P-MOSFET 34p. The level translator 36, which is coupled to the power supplies VDD and VSS1, is constructed from two P-MOSFETs 38, 40 and two N-MOSFETs 42, 44. The sources of P-MOSFETs 38, 40 are coupled together and to the power supply VDD. The drains of P-MOSFETs 38, 40 are coupled to the drains of N-MOSFETs 42, 44, respectively, which in turn have their sources coupled together and to the power supply VSS1. The gate of N-MOSFET 44 is coupled to the drain of P-MOSFET 38, and the gate of N-MOSFET 42 is coupled to the drain of P-MOSFET 40 and to the output WL. The gate of P-MOSFET 38 is coupled to the output of inverter 34, and the gate of P-MOSFET 40 is coupled to the input WLORB.

According to one embodiment, P-MOSFET 34p has a channel width of 8 microns and a channel length of 0.6 microns, N-MOSFET 34n has a channel width of 4 microns and a channel length of 0.6 microns, P-MOSFETs 38, 40 each have a channel width of 18 microns and a channel length of 0.6 microns, and N-MOSFETs 42, 44 each have a channel width of 9 microns and a channel length of 0.6 microns. It should be understood, however, that these are only example channel sizes and that they may be changed without departing from the scope of the present invention.

During operation, the input WLORB and inverter 34 cause the gate of one of P-MOSFETs 38, 40 to be pulled high and the gate of the other P-MOSFET 38, 40 to be pulled low. For example, when the input WLORB is low (i.e., at the voltage level VSS), the gate of P-MOSFET 40 is pulled low which turns it on. When P-MOSFET 40 is turned on, the output WL is pulled up to the voltage level VDD. This, in turn, pulls the gate of N-MOSFET 42 high so that it also turns on. When N-MOSFET 42 turns on, the gate of N-MOSFET 44 is pulled low and the device is biased off. As a result, the word line WL is pulled up to the voltage level VDD. However, when the input WLORB is high (i.e., at the voltage level VDD), the gate of P-MOSFET 38 is pulled low by inverter 34 which turns on P-MOSFET 38. When P-MOSFET 38 is turned on, the gate of N-MOSFET 44 is pulled high so that it also turns on. Because the N-MOSFET 44 is turned on, the output WL is pulled down to the voltage level VSS1.

It should be well understood that the specific values for Δ and the voltage level VSS1 will vary depending upon several factors, such as, for example, the threshold voltages $V_{TH}$ of the pass N-MOSFETs 12, 22, 24, the power supplied to the transistors, and how "hard" the transistors are turned off. In the above example, a Δ of 0.2 was used for illustrative purposes. It should be well understood, however, that Δ may be set equal to a value other than 0.2. Likewise, the voltage supply VSS may also vary, which will in turn vary the voltage supply VSS1.

It should be well understood that the circuit shown in FIG. 3 is just one example of a circuit which may be used to implement the function of the word line driver 16 and that many other types of circuits and devices may be used to implement its function without departing from the scope of the invention. For example, it is possible that a CMOS inverter alone that is coupled to the power supplies VDD and VSS1 could be used as the word line driver 16. However, it has been found that such an inverter's output may not be capable of being pulled all the way up to the voltage level VDD.

In the DRAM storage cell 10 and the SRAM storage cell 20 discussed above, the pass transistors 12, 22, 24 are all N-MOSFETs. It is envisioned, however, that the teachings of the present invention will apply to storage cells in which the pass transistors 12, 22, 24 are P-MOSFETs, or even PN-MOSFET transmission gates. For example, assume that the pass N-MOSFET 12 in the DRAM 10 is exchanged for a P-MOSFET. In this scenario, when the storage node 14 is precharged to approximately the voltage level VDD, then the gate of the P-MOSFET (which replaced the N-MOSFET 12) must be pulled high in order to switch it off. If the threshold voltage $V_{TH}$ of the P-MOSFET is 0.0 volts, then pulling the gate of the P-MOSFET up to the voltage level VDD will cause current leakage because the source-gate voltage $V_{SG}$ of the P-MOSFET will be equal to the threshold voltage $V_{TH}$ of 0.0 volts.

In accordance with the present invention, one way to substantially reduce the current leakage of a P-MOSFET pass transistor is to pull the word line WL up to a voltage level VDD1 which is equal to VDD+Δ. Pulling the word line WL up to a voltage level above VDD will ensure that the P-MOSFET is reversed biased so that leakage current is substantially reduced. In order to drive the word line WL in such a manner, the word line driver 16 is coupled to a voltage supply VDD1=VDD+Δ and the voltage supply VSS. Specifically, for the circuit shown in FIG. 3, the level translator 36 is coupled to the voltage supplies VDD1 and VSS. Again, it should be well understood that the specific values for Δ and the voltage level VDD1 will vary depending upon several factors, such as, for example, the threshold voltages $V_{TH}$ of the P-MOSFETs and how completely a user wishes to switch them off. An example for one value of Δ in this scenario is 0.2. Because the value of the voltage supply VDD will vary for different applications, the voltage supply VDD1 will also vary.

Therefore, in order to substantially reduce the leakage current of the pass transistors 12, 22, 24 in the storage cells 10, 20, the word line WL is pulled down to the voltage level VSS1 when the pass transistors 12, 22, 24 are N-MOSFETs, and the word line WL is pulled up to the voltage level VDD1 when the pass transistors 12, 22, 24 are P-MOSFETs. In other words, the bias voltage applied to the gates of the pass transistors 12, 22, 24 via the word line WL for switching the transistors into a nonconducting state should have a value falling outside of an operating voltage range having a lower limit approximately equal to the voltage level VSS and an upper limit approximately equal to the voltage level VDD.

Figure 4:
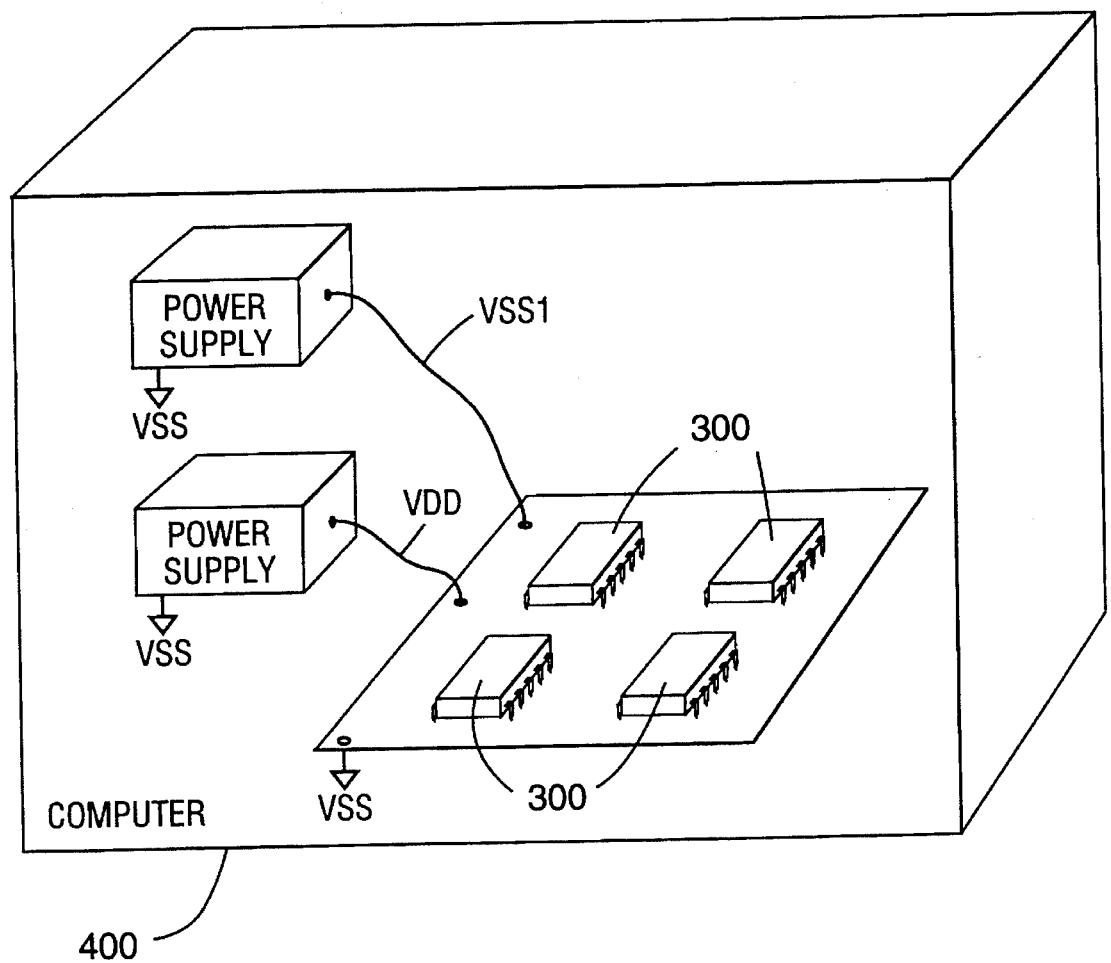
FIG. 4 represents the integration of a storage cell in accordance with the present invention within an integrated circuit and the incorporation thereof within a computer.

Referring to FIG. 4, storage cells 10, 20 in accordance with the present invention can be used perhaps most advantageously when integrated within an integrated circuit (IC) 300. In accordance with the foregoing discussion, a plurality of storage cells 10, 20 may be integrated into stand alone memory chips or other chips requiring on board memory, such as microprocessors respectively. Such ICs 300 can be operated at a reduced power supply voltage VDD level while simultaneously retaining high frequency of operation (i.e. high clocking speeds). Furthermore, by incorporating a number of such ICs 300 into a computer 400, the system power supply requirements (e.g. output power levels, filtering, etc.) and system cooling requirements (e.g. fan size and power, quantities and sizes of heat sinks, air filters, etc.) can be relaxed, thereby resulting in a lighter, cooler-running system.

Various other modifications and alterations in the structure and method of operation of this invention will be apparent to those skilled in the art without departing from the scope and spirit of the invention. For example, the technique of reducing current leakage can be used in any memory using pass transistors such as a read only memory (ROM) as well as a variety of other types of logic circuits. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A memory device, comprising:
   a storage cell having a storage node for holding a logic state indicative of a first data value;
   a bit line associated with the storage cell;
   a pass transistor coupled to the bit line and the storage node of the storage cell;
   a reverse-biasing circuit, coupled to the pass transistor, for reverse-biasing the pass transistor regardless of whether the storage node is maintained at a logical 1 or a logical 0.

2. The memory device of claim 1, wherein the reverse-biasing circuit is a driver circuit for driving a word line coupled to the gate of the pass transistor, wherein the driver circuit is for driving the word line to a first voltage to activate the pass transistor during the active state of the memory device and for driving the word line to a second voltage sufficient to reverse-bias the pass transistor when the storage cell is not being accessed.

3. The memory device of claim 2, wherein the driver circuit, which operates between a first power supply voltage and a second power supply voltage, comprises a voltage shift circuit for generating the second voltage sufficient to reverse-bias the pass transistor.

4. The memory device of claim 3, wherein the pass transistor operates within a voltage range defined by the first power supply voltage and the second power supply voltage.

5. The memory device of claim 1, wherein the storage cell comprises a capacitor.

6. The memory device of claim 1, wherein the storage cell comprises a pair of cross-coupled inverters.

7. The memory device of claim 1, wherein the pass transistor is a MOSFET device.

8. The memory device of claim 7, wherein the MOSFET device comprises one of the following: an N-channel MOSFET, a P-channel MOSFET, or a PN channel transmission gate.

9. The memory device of claim 1, wherein the storage cell and the pass transistor comprise a dynamic random access memory.

10. The memory device of claim 1, further comprising:
    a complementary storage node in the storage cell for holding a complementary logic state indicative of a second data value complementary to the first data value;
    a complementary bit line associated with the storage cell;
    a complementary pass transistor coupled to the complementary bit line and the complementary storage node of the storage cell;
    wherein the reverse-biasing circuit, coupled to the complementary pass transistor, is further for reverse-biasing the complementary pass transistor.

11. The memory device of claim 10, wherein the storage cell, the pass transistor and the complementary pass transistor comprise a static random access memory.

12. The memory device of claim 1, wherein the reverse-biasing circuit maintains a negative gate-to-source voltage on the pass transistor.

13. The memory device of claim 1, wherein the reverse-biasing circuit maintains a positive gate-to-source voltage on the pass transistor.

14. A method of providing a memory device, comprising the steps of:
    providing a storage cell having a storage node for holding a logic state indicative of a data value;
    providing a bit line associated with the storage cell;

providing a pass transistor coupled to the bit line and the storage node of the storage cell; and providing a reverse-biasing circuit, coupled to the pass transistor, for reverse-biasing the pass transistor regardless of whether the storage node is maintained at a logical 1 or a logical 0.

15. The method of claim 14, wherein the step of providing a reverse-biasing circuit further includes the step of providing a driver circuit for driving a word line coupled to the gate of the pass transistor, wherein the driver circuit is for driving the word line to a first voltage to activate the pass transistor during the active state of the memory device and for driving the word line to a second voltage sufficient to reverse-bias the pass transistor when the storage cell is not being accessed.

16. A method of operating a memory cell including a storage node for holding a logic state indicative of a data value, a bit line associated with the memory cell, and a pass transistor coupled between the storage node and the bit line, comprising the steps of:

maintaining the pass transistor in a substantially reversed-biased state regardless of whether the storage node is maintained at a logical 1 or a logical O.

17. The method of claim 16, further comprising the step of substantially reducing leakage current through the pass transistor during the step of maintaining the pass transistor in a substantially reversed-biased state.

18. The method of claim 16, further comprising the step of applying a turn on voltage to the pass transistor when accessing the memory cell.

19. The method of claim 16, further comprising the steps of:

operating the pass transistor within a voltage operating range defined by a first supply voltage and a second supply voltage; and applying a reverse-bias voltage to the pass transistor during the standby mode of the memory cell for maintaining the memory cell in the reverse-bias state, wherein the reverse-bias voltage is outside of the voltage operating range.

20. The method of claim 16, further comprising the step of applying a reverse-bias voltage to the gate of the pass transistor through a word line coupled to the gate of the pass transistor during the maintaining step.

21. The method of claim 20, further comprising the step of driving the word line with a word line driver circuit, wherein the word line driver circuit maintains the word line at a first voltage when accessing the memory cell and maintains the word line at a second voltage which reverse-biases the pass transistor when the memory cell is not being accessed.

22. The memory device of claim 1, further comprising an integrated circuit into which the memory device is integrated.

23. The memory device of claim 1, further comprising a computer into which the memory device is incorporated.

* * * * *